(12) United States Patent
Estacio et al.

(10) Patent No.: US 11,088,046 B2
(45) Date of Patent: Aug. 10, 2021

(54) SEMICONDUCTOR DEVICE PACKAGE WITH CLIP INTERCONNECT AND DUAL SIDE COOLING

(71) Applicant: SEMICONDUCTOR COMPONENTS INDUSTRIES, LLC, Phoenix, AZ (US)

(72) Inventors: Maria Cristina Estacio, Lapulapu (PH); Elsie Agdon Cabahug, Consolacion (PH); Romel N. Manatad, Liloan (PH)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/016,712

(22) Filed: Jun. 25, 2018

(65) Prior Publication Data
US 2019/0393119 A1    Dec. 26, 2019

(51) Int. Cl.
*H01L 23/495*    (2006.01)
*H01L 23/367*    (2006.01)
*H01L 23/29*    (2006.01)

(52) U.S. Cl.
CPC .......... *H01L 23/367* (2013.01); *H01L 23/29* (2013.01); *H01L 23/49517* (2013.01); *H01L 23/49562* (2013.01); *H01L 23/49575* (2013.01)

(58) Field of Classification Search
CPC .............. H01L 23/49568; H01L 23/36; H01L 23/3675; H01L 23/3677
See application file for complete search history.

(56) References Cited

U.S. PATENT DOCUMENTS

| | | | |
|---|---|---|---|
| 6,723,582 B2 * | 4/2004 | Glenn | H01L 23/49524 438/107 |
| 7,838,340 B2 | 11/2010 | Cruz et al. | |
| 7,880,280 B2 * | 2/2011 | Otremba | H01L 24/40 257/676 |
| 7,898,067 B2 | 3/2011 | Jereza | |
| 8,193,618 B2 * | 6/2012 | Madrid | H01L 24/92 257/670 |
| 8,222,718 B2 | 7/2012 | Jereza et al. | |
| 8,497,164 B2 | 7/2013 | Jereza et al. | |
| 8,513,059 B2 * | 8/2013 | Cruz | H01L 24/41 438/112 |
| 8,519,520 B2 * | 8/2013 | Gong | H01L 23/49524 257/676 |

(Continued)

*Primary Examiner* — Ismail A Muse
(74) *Attorney, Agent, or Firm* — Brake Hughes Bellermann LLP

(57) ABSTRACT

In a general aspect, a packaged semiconductor device apparatus a conductive paddle, a semiconductor die coupled with the conductive paddle and a conductive clip having a first portion with a first thickness and a second portion with a second thickness. The first thickness can be greater than the second thickness. The first portion can be coupled with the semiconductor die. The device can also include a molding compound encapsulating the semiconductor die and at least partially encapsulating the conductive paddle and the conductive clip. The device can further include a signal lead that is at least partially encapsulated in the molding compound, the second portion of the conductive clip being coupled with the signal lead.

11 Claims, 7 Drawing Sheets

(56) References Cited

U.S. PATENT DOCUMENTS

| | | | |
|---|---|---|---|
| 8,531,016 B2* | 9/2013 | Cho | H01L 23/3735 257/675 |
| 8,680,658 B2* | 3/2014 | Shi | H01L 24/40 257/673 |
| 8,841,167 B1* | 9/2014 | Gong | H01L 23/49562 257/E23.044 |
| 9,355,942 B2* | 5/2016 | Samson | H01L 23/49517 |
| 9,362,192 B2* | 6/2016 | Takagi | H01L 23/28 |
| 9,478,484 B2* | 10/2016 | Otremba | H01L 23/49548 |
| 9,496,208 B1* | 11/2016 | Ostrowicki | H02M 7/003 |
| 2003/0075785 A1* | 4/2003 | Crowley | H01L 23/49513 257/676 |
| 2004/0080028 A1* | 4/2004 | Yanagisawa | H01L 23/4334 257/675 |
| 2007/0090463 A1* | 4/2007 | Xiaochun | H01L 23/3107 257/369 |
| 2007/0290336 A1* | 12/2007 | Sun | H01L 23/49562 257/735 |
| 2008/0087992 A1* | 4/2008 | Shi | H01L 24/73 257/670 |
| 2008/0173991 A1* | 7/2008 | Cruz | H01L 23/49562 257/676 |
| 2008/0265326 A1* | 10/2008 | Hebert | H01L 23/62 257/355 |
| 2009/0230519 A1* | 9/2009 | Otremba | H01L 23/49524 257/666 |
| 2010/0109134 A1 | 5/2010 | Jereza | |
| 2010/0176508 A1* | 7/2010 | Herbsommer | H01L 24/37 257/718 |
| 2011/0272794 A1* | 11/2011 | Cruz | H01L 23/49575 257/666 |
| 2012/0248521 A1* | 10/2012 | Herbsommer | H02M 3/00 257/299 |
| 2012/0248564 A1* | 10/2012 | Hauenstein | H01L 23/34 257/467 |
| 2013/0075884 A1* | 3/2013 | Gong | H01L 25/50 257/676 |
| 2014/0061884 A1* | 3/2014 | Carpenter | H01L 23/49524 257/676 |
| 2014/0154843 A1* | 6/2014 | Liu | H01L 23/49568 438/123 |
| 2015/0035129 A1* | 2/2015 | Zhang | H01L 23/49524 257/675 |
| 2015/0162261 A1* | 6/2015 | Cho | H01L 23/49524 257/76 |
| 2015/0214138 A1* | 7/2015 | Takagi | H01L 23/49568 257/675 |
| 2015/0241936 A1* | 8/2015 | Hur | G06F 1/203 361/679.54 |
| 2015/0332989 A1* | 11/2015 | Samson | H01L 23/49517 257/670 |
| 2017/0062316 A1* | 3/2017 | Mukhopadhyay | H01L 23/367 |
| 2017/0110341 A1* | 4/2017 | Onoda | H01L 25/07 |
| 2017/0207150 A1* | 7/2017 | Choi | H01L 23/49562 |
| 2017/0330818 A1* | 11/2017 | Yamagishi | H01L 23/29 |
| 2018/0174951 A1* | 6/2018 | Fan | H01L 23/49568 |
| 2018/0240731 A1* | 8/2018 | Choi | H01L 23/3677 |
| 2018/0240740 A1* | 8/2018 | Tu | H01L 29/7816 |
| 2018/0240770 A1* | 8/2018 | Choi | H01L 23/4952 |
| 2019/0221490 A1* | 7/2019 | Fujita | H01L 24/49 |
| 2019/0393137 A1* | 12/2019 | Yandoc | H01L 24/84 |

* cited by examiner

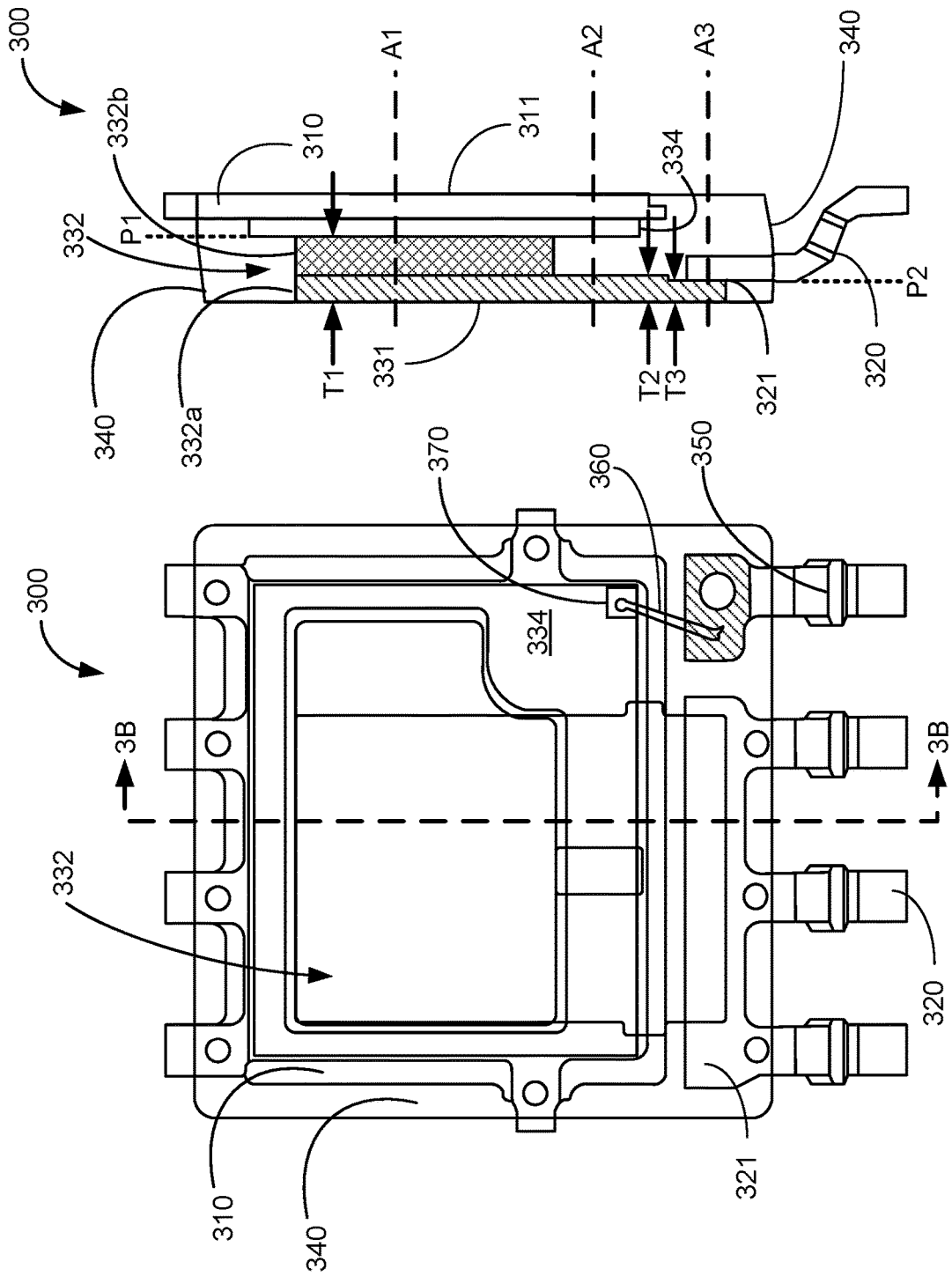

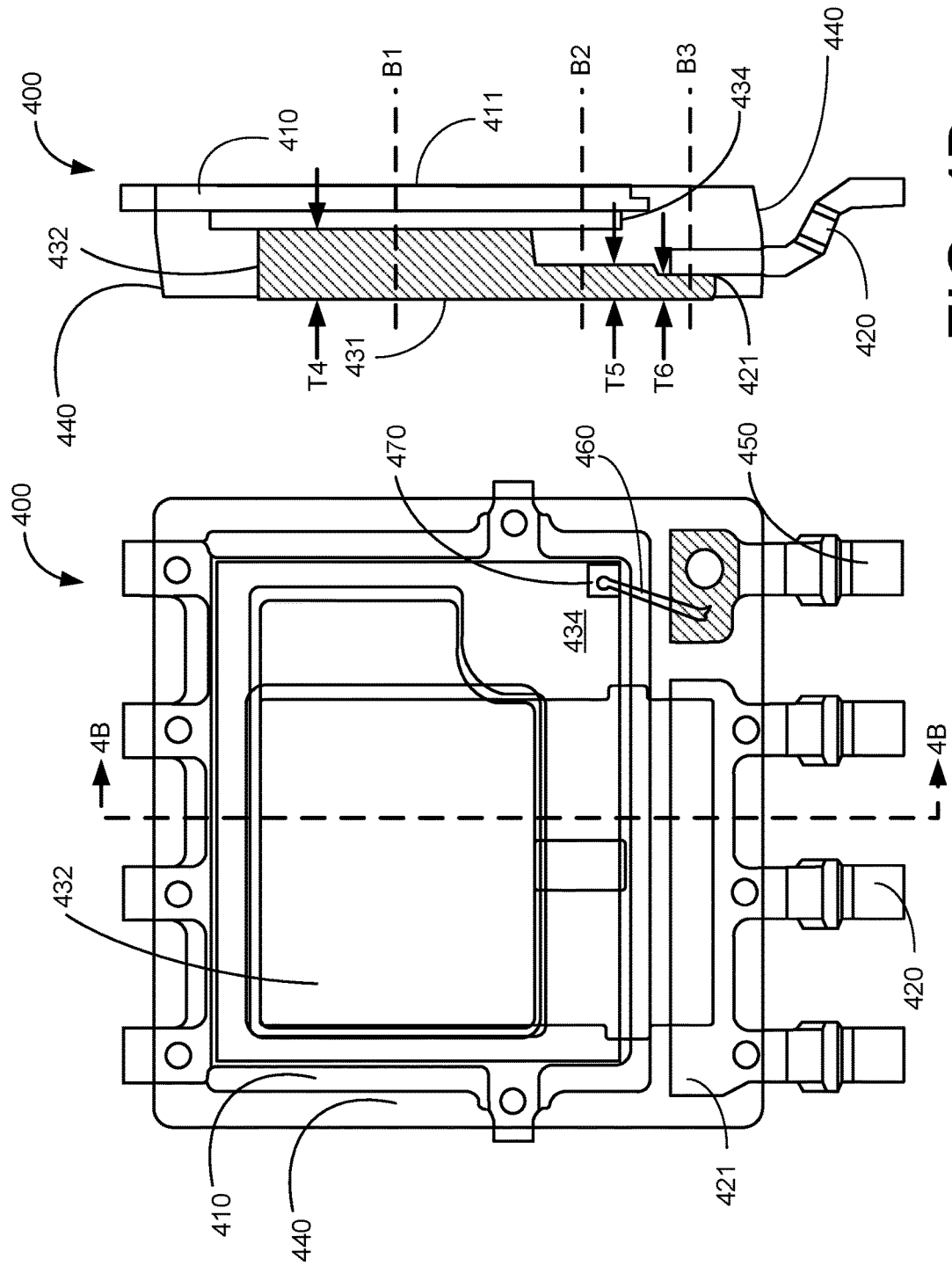

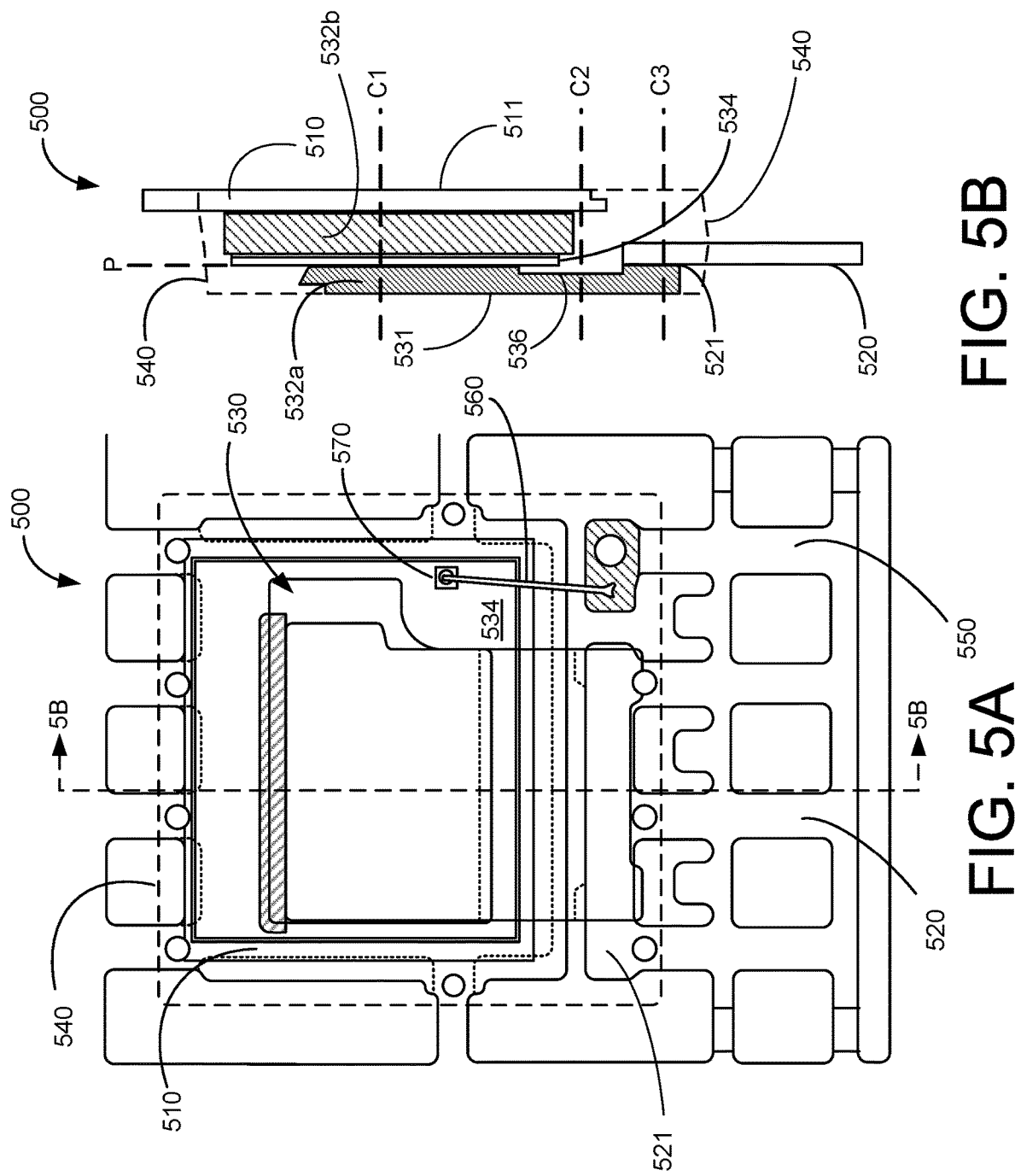

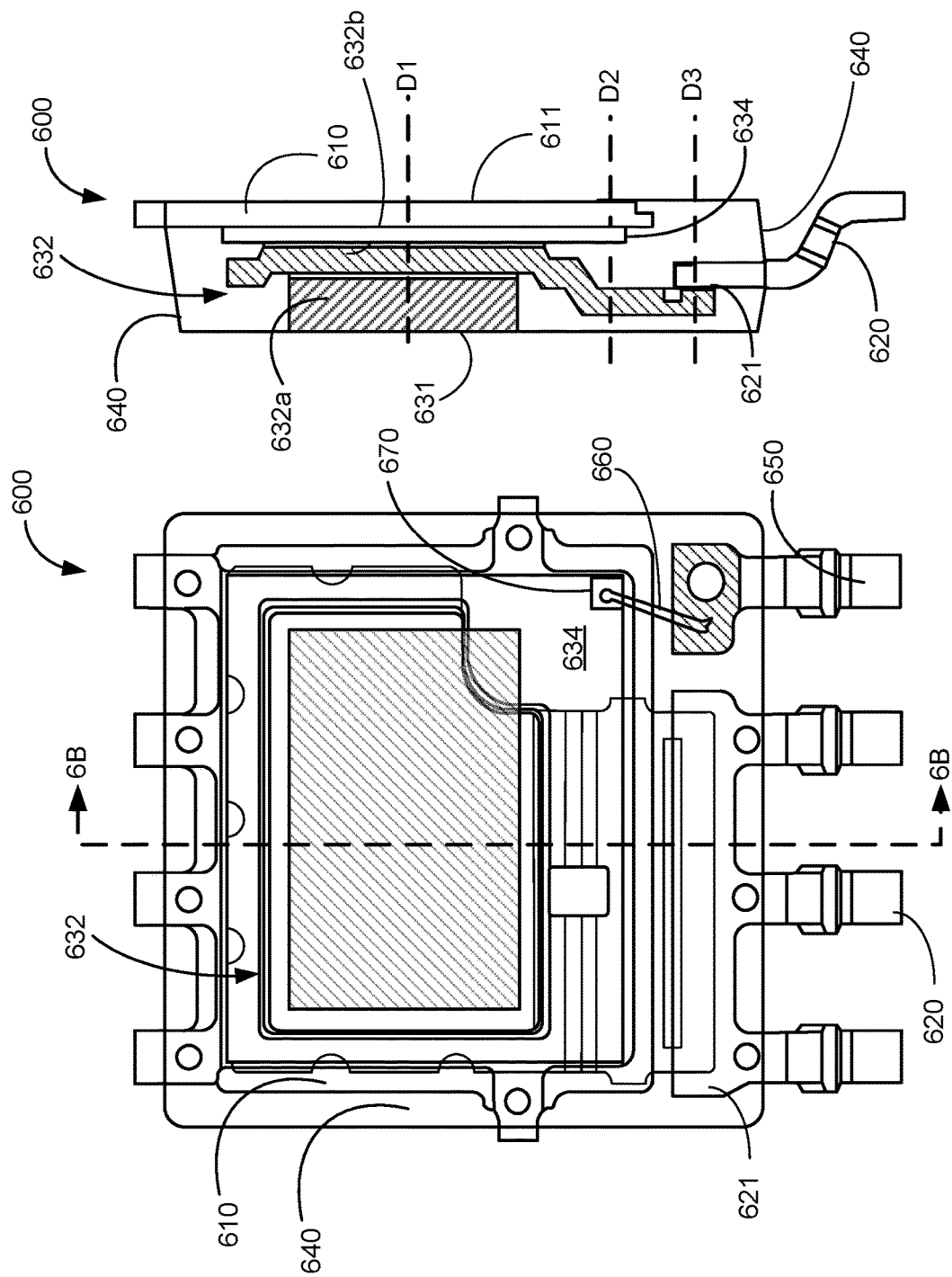

SEMICONDUCTOR DEVICE PACKAGE WITH CLIP INTERCONNECT AND DUAL SIDE COOLING

TECHNICAL FIELD

This description relates to semiconductor device packages. More specifically, this description relates to semiconductor device packages that include interconnection clips and allow for heat dissipation (cooling) from multiple sides of a package.

BACKGROUND

Efficient heat dissipation is important for semiconductor devices, e.g., power semiconductor devices that are included in semiconductor device package assemblies. Having multiple surfaces of a semiconductor package that can provide efficient heat dissipation for such semiconductor device packages can improve performance of an included semiconductor device (die, device, etc.), as well as reduce the risk of damage to the device due to overheating. However, current approaches for providing efficient heat dissipation on multiple surfaces of a semiconductor device package are not compatible with some semiconductor device packages configurations, such as package assemblies where a contact surface of a signal lead is not coplanar with a surface of a semiconductor die that is to be electrically coupled with the signal lead.

SUMMARY

In a general aspect, a packaged semiconductor device apparatus can include a conductive paddle, a semiconductor die coupled with the conductive paddle and a conductive clip having a first portion with a first thickness and a second portion with a second thickness. The first thickness can be greater than the second thickness. The first portion can be coupled with the semiconductor die. The device can also include a molding compound encapsulating the semiconductor die and at least partially encapsulating the conductive paddle and the conductive clip. The device can further include a signal lead that is at least partially encapsulated in the molding compound, the second portion of the conductive clip being coupled with the signal lead.

In another general aspect, a packaged semiconductor device apparatus can include a conductive paddle, and a semiconductor die having a first surface coupled with the conductive paddle and a second surface being disposed in (aligned along, aligned in, arranged in, etc.) a first plane. The second surface of the semiconductor die can be opposite the first surface. The device can further include a conductive clip having a first portion with a first thickness and a second portion with a second thickness. The first thickness can be greater than the second thickness. The first portion can be coupled with the second surface of the semiconductor die. The device can also include a signal lead having a surface coupled with the second portion of the conductive clip. The surface of the signal lead can be disposed in (aligned along, aligned in, arranged in, etc.) a second plane that is parallel with the first plane, the second plane being non-coplanar with the first plane.

In another general aspect, a packaged semiconductor device apparatus can include a conductive paddle and a first conductive clip piece having a first surface coupled with the conductive paddle and a second surface that is opposite the first surface. The device can also include a semiconductor die having a first surface coupled with the second surface of the first conductive clip piece and a second surface being disposed in (aligned along, aligned in, arranged in, etc.) a plane. The second surface of the semiconductor die can be opposite the first surface of the semiconductor die. The device can also include a second conductive clip piece having a first surface and a second surface opposite the first surface. A first portion of the first surface of the second conductive clip piece can be coupled with the second surface of the semiconductor die. The device can also further include a signal lead having a surface coupled with a second portion of the first surface of the second conductive clip piece. The surface of the signal lead can be disposed in (aligned along, aligned in, arranged in, etc.) the plane of the second surface of the semiconductor die. The device can still further include a molding compound encapsulating the semiconductor die, encapsulating the first conductive clip piece, at least partially encapsulating the conductive paddle, at least partially encapsulating the second conductive clip piece, and at least partially encapsulating the signal lead.

BRIEF DESCRIPTION OF THE DRAWINGS

FIG. 3A is a diagram illustrating a plan view of a semiconductor device package.

FIG. 3B is a diagram illustrating a side view of the semiconductor device package of FIG. 3A.

FIG. 4A is a diagram illustrating a plan view of a semiconductor device package.

FIG. 4B is a diagram illustrating a side view of the semiconductor device package of FIG. 4A.

FIG. 5A is a diagram illustrating a plan view of a semiconductor device package.

FIG. 5B is a diagram illustrating a side view of the semiconductor device package of FIG. 4A.

FIG. 6A is a diagram illustrating a plan view of a semiconductor device package.

FIG. 6B is a diagram illustrating a side view of the semiconductor device package of FIG. 6A.

Figure 1:
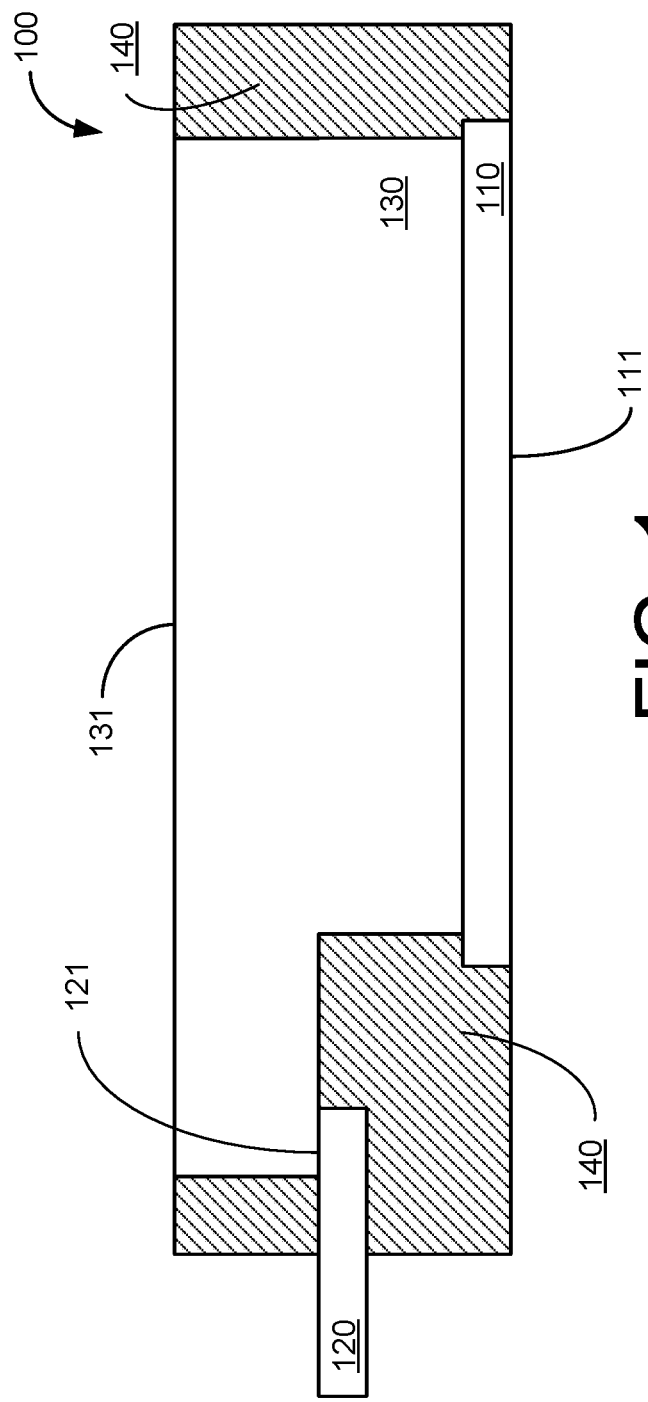
FIG. 1 is a block diagram schematically illustrating a semiconductor device package.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols show in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of that element are illustrated.

DETAILED DESCRIPTION

FIG. 1 is a block diagram schematically illustrating a semiconductor device package (e.g., a packaged semiconductor device, a device, etc.) 100. The device 100 provides for dual-sided cooling for power semiconductor devices included (on a semiconductor die) in the device 100, and also allows for the use of (can include) a conductive clip to electrically couple a semiconductor die included in the device 100 with a signal lead (signal post, etc.) to allow for electrical access to the semiconductor die when included in a device package that is not compatible with current approaches, such as indicated above.

The device 100 includes a conductive paddle 110, a signal lead 120, a semiconductor die and conductive clip assembly (assembly) 130, and a molding compound 140. In some implementations, the conductive paddle 110 can be a paddle (e.g., a pad, a die attach paddle, a die pad, etc.) that is formed from a copper metal sheet. In some implementations, the conductive paddle 110 can be coupled (e.g., directly coupled, electrically coupled) with a surface of a semiconductor die included the assembly 130. In some implementations, the conductive paddle 110 can be coupled (e.g., directly coupled, electrically coupled) with a surface of a conductive clip (e.g., a first piece of a multi-part conductive clip). Examples of such implementations are illustrated in FIGS. 2-6B and described below.

In the device 100, the signal lead 120 can have a contact surface 121 where the assembly 130 is coupled (e.g., directly coupled, electrically coupled) to the signal lead 120. In some implementations, the assembly 130 can include a semiconductor die and a conductive clip (e.g., a monolithic clip or a multi-part clip), where the conductive clip is configured to electrically couple the semiconductor die of the assembly with the signal lead 120 via the contact surface 121.

For example, the semiconductor die of the assembly 130 can be a metal-oxide semiconductor field-effect transistor (MOSFET), such as a power MOSFET, and a conductive clip of the assembly 130 can be configured to provide an electrical connection between a source terminal of the MOSFET and the contact surface 121, to electrically couple the signal lead 120 with the source terminal. In this example, a drain terminal of the MOSFET can be electrically coupled with the conductive paddle 110, either directly or via a piece of a multi-piece conductive clip of the assembly 130.

In the device 100, the molding compound 140 can be an epoxy molding compound, or other appropriate molding compound for use in semiconductor device packages. The device 100 can, for example, be molded using an injection molding process, a transfer molding process, or any other appropriate molding process. As shown in FIG. 1, the molding compound 140 can at least partially encapsulate the conductive paddle 110, the signal lead 120 and the assembly 130. In some implementations, the molding compound 140 can fully encapsulate a semiconductor die included in the assembly 130, such as in the various example implementations described herein.

As also shown in FIG. 1, a surface 111 of the conductive paddle 110 can be exposed through the molding compound 140 on a first side of the device 100. As also shown in FIG. 1, a surface 131 of the assembly 130 (e.g., a surface of a conductive clip of the assembly 130) can be exposed through the molding compound 140 on a second side of the device 100, where the second side of the device 100 is opposite the first side. In some implementations, the device 100 can, during a manufacturing process, initially be overmolded (with the molding compound covering the exposed surfaces 111 and 131), and a grinding process can be performed to expose the surfaces 111 and 131. Dual-side cooling for a semiconductor die included in the device 100 (e.g., included in the assembly 130) can be facilitated by (provided by, etc.) the exposed surfaces 111 and 131.

Figure 2:
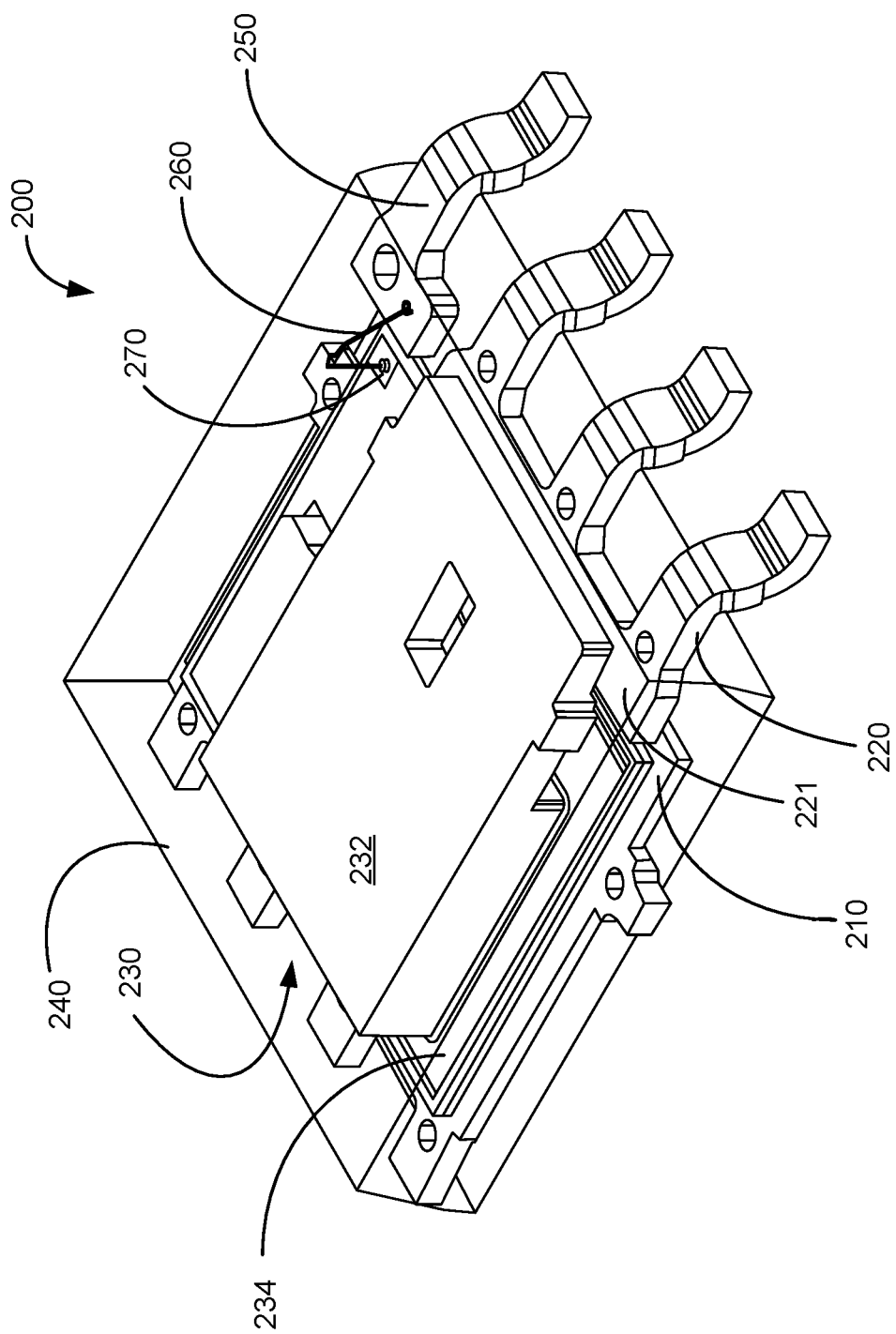
FIG. 2 is a diagram illustrating an isometric view of a semiconductor device package.

FIG. 2 is a diagram illustrating an isometric view of a semiconductor device package (device) 200. The device 200, in FIG. 2, is illustrated as an X-ray view, where internal elements of the device 200 that would not be visible in a physical device implementation are shown, for purposes of illustration, in place in FIG. 2. As shown in FIG. 2, the device 200 includes a conductive paddle 210, a signal lead (signal leads) 220, a semiconductor die and conductive clip assembly 230, and molding compound 240. The device 200 further includes a signal lead 250 and a wire bond 260.

In the device 200 of FIG. 2, the assembly 230 includes a conductive clip 232 and a semiconductor die 234. In this example, the semiconductor die 234 can include a power MOSFET device, which includes a drain terminal that is coupled with (e.g., directly coupled with) the conductive pad 210, a source terminal that is coupled (e.g., directly coupled with) with the conductive clip 232, and a gate terminal 270. In the device 200, the conductive clip 232 electrically couples the source terminal of the semiconductor die 234 with the signal lead(s) 222, while the wire bond 260 has a first end coupled with the gate terminal 270 (e.g., a gate signal pad of the MOSFET) and a second end coupled with the signal terminal 250 to electrically couple the signal terminal 250 with the gate terminal 270. For purposes of illustration, the implementations described herein will be discussed as including a semiconductor die that includes a power MOSFET device. It will be appreciated, however, that the approaches described herein can be used with semiconductor die including devices, or circuits, other than power MOSFET devices.

In the device 200, the top facing surface (as arranged in FIG. 2) of the die 234 (e.g., a surface including the source terminal connection for the included power MOSFET) can be disposed in (aligned along, aligned in, arranged in, etc.) a first plane, while a contact surface 221 for the signal lead(s) 220 can be disposed in (aligned along, aligned in, arranged in, etc.) a second plane, where the second plane is not coplanar with the first plane of the semiconductor die. As shown in FIG. 2, the conductive clip 232 of the device 200 can be a dual gauge conductive clip (e.g., a conductive clip having different portions with different thicknesses), which can allow the conductive clip to electrically couple the semiconductor die 234 (e.g., the source terminal of the included power MOSFET) with the contact surface 221 of the signal lead(s) 220, while having a surface exposed through the molding compound 240 to provide, in combination with an exposed surface of the conductive pad 210 on an opposite side of the device 200, dual-sided cooling for the device 200.

In some implementations, the conductive clip 232 can be formed using a metal rolling processes, where the different gauges (different thicknesses) are formed using separate rolling processes (e.g., on a copper, or other metal, sheet) to obtain the multi-gauge conductive clip 232. In some implementations, a solder reflow process can be used to couple (e.g., electrically, physically and/or thermally couple) components of the device 200 (or other components of other example devices described herein) with each other. For instance a solder reflow process can be used to couple the semiconductor die 234 with the conductive pad 210, couple the conductive clip 232 with the semiconductor die 234, and/or couple the conductive clip 232 with the contact surface 221.

FIGS. 3A and 3B are diagrams illustrating a semiconductor device package (device) 300. FIG. 3A is a diagram illustrating a plan, X-ray view of the device 300. FIG. 3B is a diagram illustrating a side, cross-sectional view of the semiconductor device package 300 along section line 3B-3B in FIG. 3A. The device 300 includes a conductive paddle 310, a signal lead (signal leads) 320, a multi-part conductive clip 332, a semiconductor die (including a power MOSFET) 334, and molding compound 340. The device 300 further includes a signal lead 350, and a wire bond 360.

In the device 300, the multi-part conductive clip 332 includes a first conductive clip piece 332a and a second conductive clip piece 332b, that can be used to produce a multi-gauge conductive clip, similar to the clip 232 discussed above with respect to FIG. 2. In some implementations, the clip piece 332a can be a same thickness as the clip piece 332b. Accordingly, pieces 332a and 332b of the multi-part clip 332 can be formed using a single metal rolling process.

As shown in FIG. 3B, the conductive clip piece 332b can be disposed between the semiconductor die 334 and the clip piece 332a. The clip piece 332a can have a surface 331 that is exposed through the molding compound 340, while the conductive pad 310 can have a surface 311 that is exposed through the molding compound 340 on an opposite side of the device 300 from the surface 331. The surfaces 311 and 331 can be used to provide dual-sided cooling for the device 300.

As shown in FIG. 3B, the surface of the die 334 that is coupled with the clip piece 332b can be disposed in (aligned along, aligned in, arranged in, etc.) a first plane P1, while a contact surface 321 for the signal lead(s) 320 can be disposed in (aligned along, aligned in, arranged in, etc.) a second plane P2, where the second plane P2 is not coplanar with the first plane P2 of the semiconductor die 334. As also shown in FIG. 3B, the multi-part conductive clip 332 of the device 300 can have a first portion with a thickness T1 along an axis A1 and a second portion with a thickness T2 along an axis A2. In some implementations, the thickness T1 can be at least twice the thickness T2. As shown in FIG. 3, in some implementations, the multi-part clip 332 can have a third portion with a third thickness T3 along an axis A3, where the thickness T3 is less than the thickness T2. The third portion of the clip 332 (with the thickness T3 as shown in FIG. 3B) can be formed using a coining (e.g., a metal stamping) process. In some implementations, the third portion of the clip 332 along the axis A3 can be of a same thickness as the thickness T2 along the axis A2 (e.g., may not be coined to the thickness T3). The exact thicknesses T1, T2 and T3 will depend on the particular implementation, such as a thickness of the semiconductor die 334 and/or the thicknesses T1 and T2. The multiple thicknesses of the clip 332 allow for electrically coupling the semiconductor die 334 in plane P1 with the contact surface 321 of the signal lead(s) 320 in plane P2, while also providing for (in combination with the conductive pad 310) dual-sided cooling for the device 300.

Referring to FIG. 3B, the elements of the device 300 are arranged (e.g., coupled with each other) in a stacked arrangement. As discussed above, at least some of the elements of the device 300 can be coupled with each other using a solder reflow process to form electrical, physical and/or thermal connections. For example, in the device 300, from left-to-right along the axis A1, the clip piece 232a is coupled with the clip piece 232b, the clip piece 232b is coupled with the semiconductor die 334 (e.g., a source terminal), and the semiconductor die 334 is coupled with the conductive pad 310. From left-to-right along axis A2, shown in FIG. 3B, the device 300 includes the clip piece 332a, the molding compound 340, the semiconductor die 334 and the conductive pad 310. Along the axis A3, the device 300 includes the clip piece 332a, the signal lead 320 (e.g., the contact surface 321) and the molding compound 340.

FIGS. 4A and 4B are diagrams illustrating a semiconductor device package (device) 400, which is similar to, at least, the device 200 of FIG. 2. FIG. 4A is a diagram illustrating a plan, X-ray view of the device 400. FIG. 4B is a diagram illustrating a side, cross-sectional view of the semiconductor device package 400 along section line 4B-4B in FIG. 4A. The device 400 includes a conductive paddle 410, a signal lead (signal leads) 420, a multi-gauge, monolithic conductive clip 432, a semiconductor die (including a power MOSFET) 434, and molding compound 440. The device 400 further includes a signal lead 450, and a wire bond 460. In the device 400, the multi-gauge conductive clip 432, that can be formed using multiple rolling processes and/or coining for the different gauges (thicknesses).

As shown in FIG. 4B, the conductive clip 432 can be coupled with the semiconductor die 434 and can have a surface 431 that is exposed through the molding compound 440, while the conductive pad 410 can have a surface 411 that is exposed through the molding compound 440 on an opposite side of the device 300 from the surface 431. The surfaces 411 and 431 can be used to provide dual-sided cooling for the device 400.

As shown in FIG. 4B, the multi-gauge conductive clip 432 of the device 400 can have a first portion with a thickness T4 along an axis B1 and a second portion with a thickness T5 along an axis B2. In some implementations, the thickness T4 can be at least twice the thickness T5. As shown in FIG. 4B, in some implementations, the multi-gauge clip 432 can also have a third portion with a third thickness T6 along an axis B3, where the thickness T6 is less than the thickness T5. The third portion of the clip 432 (with the thickness T6 as shown in FIG. 4B) can be formed using a coining (e.g., a metal stamping) process. In some implementations, the third portion of the clip 432 along the axis B3 can be of a same thickness as the thickness T5 along the axis B2 (e.g., may not be coined to the thickness T6). The exact thicknesses T4, T5 and T6 will depend on the particular implementation, such as a thickness of the semiconductor die 434 and/or the thicknesses T1 and T2. The multiple thicknesses of the clip 432 allow for electrically coupling the semiconductor die 434 with the contact surface 421 of the signal lead(s) (even though they are not coplanar), while also providing for (in combination with the conductive pad 410) dual-sided cooling for the device 400.

Referring to FIG. 4B, the elements of the device 400 are arranged (e.g., coupled with each other) in a stacked arrangement. As discussed above, at least some of the elements of the device 400 can be coupled with each other using a solder reflow process to form electrical, physical and/or thermal connections. For example, in the device 400, from left-to-right along the axis B1, the first portion of the multi-gauge clip 432 (of thickness T4) is coupled with the semiconductor die 434 (e.g., a source terminal), and the semiconductor die 434 is coupled with the conductive pad 410. From left-to-right along axis B2 in FIG. 4B, the device 400 includes the second portion of the multi-gauge clip 432 (of thickness T5), the molding compound 440, the semiconductor die 434 and the conductive pad 310. Along the axis B3, the device 400 includes the third portion of the multi-gauge clip 432 (of thickness T6), the signal lea 420 (e.g., the contact surface 421) and the molding compound 440.

FIGS. 5A and 5B are diagrams illustrating a semiconductor device package (device) 500. FIG. 5A is a diagram illustrating a plan, X-ray view of the device 500. FIG. 5B is a diagram illustrating a side, cross-sectional view of the semiconductor device package 500 along section line 5B-5B in FIG. 5A. As compared to FIGS. 3A, 4A and 6A, the plan view in FIG. 5A illustrates the device 500 prior to singulation of the device 500 from a leadframe strip or leadframe matrix structure, and both FIGS. 5A and 5B illustrate the device 500 without any signal lead formation having been performed, such as to form gull-wing signal leads 320, 350, 420, 450, 620 and 650, as shown in FIGS. 3A, 3B, 4A, 4B, 6A and 6B.

The device 500 of FIGS. 5A and 5B includes a conductive paddle 510, a signal lead (signal leads) 520, a semiconductor die and multi-piece conductive clip assembly (assembly) 530, and molding compound 540. The device 500 further includes a signal lead 550, and a wire bond 560.

In the device 500, the assembly 530 includes a first conductive clip piece 532a, a semiconductor die (including a power MOSFET) 534, and a second conductive clip piece 532b, that can be used to align (substantially align, approximately align, etc.) a surface of the semiconductor die 534 that is coupled with the first clip piece 532a and a contact surface 521 of the signal lead(s) 520 in a same plane. In some implementations, the clip piece 532a can be a same thickness as the clip piece 532b. Accordingly, pieces 532a and 532b of the multi-part clip 332 can be formed using a single metal rolling process.

As shown in FIG. 3B, the conductive clip piece 532b can be disposed between the semiconductor die 534 and the conductive paddle 510. The clip piece 532a can be coupled with the semiconductor die 534 and have a surface 531 that is exposed through the molding compound 540, while the conductive pad 510 can have a surface 511 that is exposed through the molding compound 540 on an opposite side of the device 500 from the surface 531. The surfaces 511 and 531 (in conjunction with the clip pieces 532a and 532b, and the conductive paddle 510) can be used to provide dual-sided cooling for the device 500.

As shown in FIG. 5B, the clip piece 532a can include a notch 536, where the notch 536 can prevent solder (e.g., during a solder reflow process) from wicking from the source terminal contacts (e.g., solder balls) of the semiconductor die 534 toward the edge of the die 534, where such solder wicking could result in quality and reliability issues for the device 500 (or other device).

Referring to FIG. 5B, the elements of the device 500 are arranged (e.g., coupled with each other) in a stacked arrangement. As discussed above, at least some of the elements of the device 500 can be coupled with each other using a solder reflow process to form electrical, physical and/or thermal connections. For example, in the device 500, from left-to-right along an axis C1, the clip piece 532a is coupled with the semiconductor die 534 (e.g., a source terminal), the semiconductor die 534 is coupled with the clip piece 532b, and the clip piece 532b is coupled with the conductive pad 510. From left-to-right along axis C2, as shown in FIG. 5B, the device 500 includes the clip piece 532a, the molding compound 540, the semiconductor die 534 and the conductive pad 510. Along the axis C3, the device 500 includes the clip piece 532a, the signal lead 520 (e.g., the contact surface 521) and the molding compound 540.

FIGS. 6A and 6B are diagrams illustrating a semiconductor device package (device) 600. FIG. 6A is a diagram illustrating a plan, X-ray view of the device 600. FIG. 6B is a diagram illustrating a side, cross-sectional view of the semiconductor device package 600 along section line 6B-6B in FIG. 6A. The device 600 includes a conductive paddle 610, a signal lead (signal leads) 620, a multi-part conductive clip 632, a semiconductor die (including a power MOSFET) 634, and molding compound 640. The device 600 further includes a signal lead 650, and a wire bond 660.

In the device 600, the multi-part conductive clip 632 includes a first conductive clip piece 632a and a second conductive clip piece 632b, that can be used to produce a multi-gauge conductive clip (e.g., the multi-part clip 632). In some implementations, the clip piece 632a can be of a same material (sheet) thickness as the clip piece 632b. Accordingly, in such implementations, the clip pieces 632a and 632b of the multi-part clip 632 can be formed using a single metal rolling process.

As shown in FIG. 6B, the conductive clip piece 632b can be disposed between the semiconductor die 634 and the clip piece 632a. The clip piece 632a can have a surface 631 that is exposed through the molding compound 640, while the conductive pad 610 can have a surface 611 that is exposed through the molding compound 640 on an opposite side of the device 600 from the surface 631. The surfaces 611 and 631 can be used to provide dual-sided cooling for the device 300.

As shown in FIG. 6B, the surface of the die 634 that is coupled with the clip piece 632b is not coplanar with a contact surface 621 for the signal lead(s) 620. In the device 600, the clip piece 632b is formed to contact both the surface of the die 634 (e.g., a source contact) and the contact surface 621. The combination of the piece 632a and the piece 632b of the multi-part clip 632 allow for electrically coupling the semiconductor die 634 (e.g., a source terminal of the MOSFET) with the contact surface 621 of the signal lead(s) 620, while also providing for (in combination with the conductive pad 610) dual-sided cooling for the device 600.

Referring to FIG. 6B, the elements of the device 600 are arranged (e.g., coupled with each other) in a stacked arrangement. As discussed above, at least some of the elements of the device 600 can be coupled with each other using a solder reflow process to form electrical, physical and/or thermal connections. For example, in the device 600, from left-to-right along the axis C1, the clip piece 632a is coupled with the clip piece 632b, the clip piece 632b is coupled with the semiconductor die 634 (e.g., a source terminal), and the semiconductor die 634 is coupled with the conductive pad 610. From left-to-right along axis C2, shown in FIG. 6B, the device 600 includes the clip piece 632b, the molding compound 640, the semiconductor die 634 and the conductive pad 610. Along the axis C3, the device 600 includes the clip piece 632b, the signal lead 620 (e.g., the contact surface 621) and the molding compound 640.

Figures 7A, 7B:
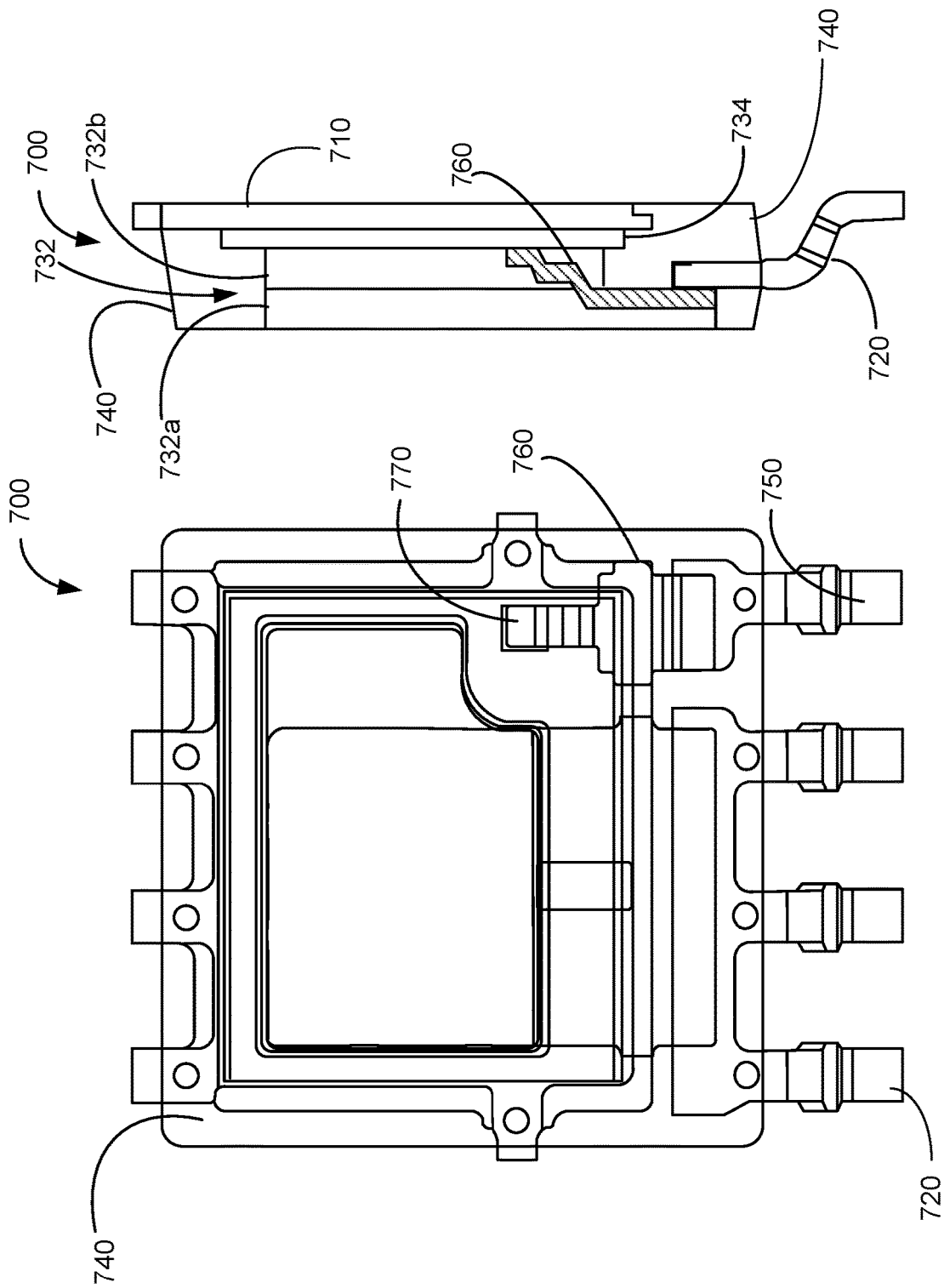
FIG. 7A is a diagram illustrating a plan view of a semiconductor device package.
FIG. 7B is a diagram illustrating a side view of the semiconductor device package of FIG. 7A.

FIGS. 7A and 7B are diagrams illustrating a semiconductor device package (device) 700. FIG. 7A is a diagram illustrating a plan, X-ray view of the device 700. FIG. 7B is a diagram illustrating a side, X-ray view of the semiconductor device package 700 from the right side of the device 700, as shown in FIG. 7A. The device 700, which is similar to the device 300 of FIGS. 3A and 3B, includes a conductive paddle 710, a signal lead (signal leads) 720, a multi-part conductive clip 732, a semiconductor die (including a power MOSFET) 734, and molding compound 740. The device 700 further includes a signal lead 750, and a second conductive clip 760. In some implementations, the clip 760 can be used to couple (e.g., electrically couple, etc.) the signal lead 750 with a gate terminal 770 of a MOSFET device that is implemented on the semiconductor die 734. For instance, the clip 760 could replace the wire bonds 360, 460, 560 and 660, respectively, in the devices 300, 400, 500 and 600 described herein.

The clip 760 can be formed using one or more metal processing operations. For instance, the clip 760 could be formed using a metal (e.g., copper) rolling process to form a metal sheet. One or more metal stamping processes could then be performed to form the clip 760 from the metal sheet. In some implementations, a first metal stamping process could be performed to cut the clip 760 from a metal sheet. After the first metal stamping process, a second metal stamping process could be performed to define the stepped arrangement of the clip 760. In some implementations, as single metal stamping process could be performed to form the clip 760 from a metal sheet, such as a copper sheet. As discussed above, at least some of the elements of the device 700 can be coupled (e.g., electrically, physically and/or thermally coupled) with each other using a solder reflow process to form electrical and physical connections, such as to couple (e.g., electrically couple, physically couple, thermally couple, etc.) the clip 760 with the signal lead 750 and the gate terminal 770 of the semiconductor die 734.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Silicon Carbide (SiC), Gallium Arsenide (GaAs), Gallium Nitride (GaN), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A packaged semiconductor device apparatus comprising:
    a conductive paddle;
    a semiconductor die coupled with the conductive paddle, the conductive paddle having a surface coupled with the semiconductor die;
    a conductive clip having a first portion with a first thickness and a second portion with a second thickness, the first thickness being greater than the second thickness, the first portion being coupled with the semiconductor die;
    a molding compound encapsulating the semiconductor die and at least partially encapsulating the conductive paddle and the conductive clip; and
    a signal lead that is at least partially encapsulated in the molding compound,
    the conductive clip including:
    a first piece included in the first portion of the conductive clip; and
    a second piece having a first portion included in the first portion of the conductive clip and a second portion included in the second portion of the conductive clip, wherein the signal lead has a surface coupled with the second piece at the second portion of the conductive clip,
    the first piece of the conductive clip being disposed between the semiconductor die and the second piece of the conductive clip, the first piece of the conductive clip being coupled to the semiconductor die and the second piece of the conductive clip being coupled to the first piece of the conductive clip.

2. The packaged semiconductor device apparatus of claim 1, wherein a surface of the conductive paddle is exposed through the molding compound on a first side of the packaged semiconductor device apparatus and a surface of the conductive clip is exposed through the molding compound on a second side of the packaged semiconductor device apparatus, the second side being opposite the first side.

3. The packaged semiconductor device apparatus of claim 1, wherein the first thickness is at least twice the second thickness.

4. A packaged semiconductor device apparatus comprising:
    a conductive paddle;
    a semiconductor die having a first surface coupled with the conductive paddle, and a second surface, the second surface of the semiconductor die being opposite the first surface, the conductive paddle having a surface coupled with the first surface of the semiconductor die;
    a conductive clip having a first portion with a first thickness and a second portion with a second thickness, the first thickness being greater than the second thickness, the first portion being coupled with the second surface of the semiconductor die,
    the conductive clip including:
    a first piece included in the first portion of the conductive clip; and
    a second piece having a first portion included in the first portion of the conductive clip and a second portion included in the second portion of the conductive clip,
    the first piece of the conductive clip being disposed between the semiconductor die and the second piece of the conductive clip, the first piece of the conductive clip being coupled to the semiconductor die and the second piece of the conductive clip being coupled to the first piece of the conductive clip; and a signal lead having a surface coupled with the second piece at the second portion of the conductive clip.

5. The packaged semiconductor device apparatus of claim 4, further comprising:

a molding compound encapsulating the semiconductor die, at least partially encapsulating the conductive paddle, at least partially encapsulating the conductive clip, and at least partially encapsulating the signal lead.

6. The packaged semiconductor device apparatus of claim 5, wherein:

the surface of the conductive paddle that is coupled with the first surface of the semiconductor die is a first surface of the conductive paddle;

a second surface of the conductive paddle, opposite the first surface of the conductive paddle, is exposed through the molding compound on a first side of the packaged semiconductor device apparatus; and the first portion of the conductive clip and the second portion of the conductive clip define a surface of the conductive clip that is exposed through the molding compound on a second side of the packaged semiconductor device apparatus, the second side being opposite the first side.

7. The packaged semiconductor device apparatus of claim 4, wherein the signal lead is a first signal lead, the packaged semiconductor device apparatus further comprising:

a second signal lead; and a wire bond having a first end coupled with the second signal lead and a second end coupled with the semiconductor die.

8. The packaged semiconductor device apparatus of claim 4, wherein the first thickness is at least twice the second thickness.

9. A packaged semiconductor device apparatus comprising:

a conductive paddle;

a semiconductor die coupled with the conductive paddle, the conductive paddle having a surface coupled with the semiconductor die;

a conductive clip having a first portion with a first thickness and a second portion with a second thickness, the first thickness being greater than the second thickness, the first portion being coupled with the semiconductor die;

a molding compound encapsulating the semiconductor die and at least partially encapsulating the conductive paddle and the conductive clip; and a signal lead that is at least partially encapsulated in the molding compound, the second portion of the conductive clip being coupled with the signal lead, the signal lead having a surface coupled with the second portion of the conductive clip, the signal lead being a first signal lead and the conductive clip being a first conductive clip, the packaged semiconductor device apparatus further comprising:

a second signal lead that is at least partially encapsulated in the molding compound; and a second conductive clip having a first end coupled with the second signal lead and a second end coupled with the semiconductor die, a surface of the conductive paddle being exposed through the molding compound on a first side of the packaged semiconductor device apparatus, and a surface of the first conductive clip being exposed through the molding compound on a second side of the packaged semiconductor device apparatus, the second side being opposite the first side.

10. The packaged semiconductor device apparatus of claim 9, wherein:

the semiconductor die includes a metal-oxide-semiconductor field-effect transistor (MOSFET);

the conductive paddle is coupled with a drain terminal of the MOSFET;

the first conductive clip is coupled with a source terminal of the MOSFET; and the second conductive clip is coupled with a gate terminal of the MOSFET.

11. The packaged semiconductor device apparatus of claim 9, wherein the first thickness is at least twice the second thickness.

* * * * *